United States Patent [19]

Uematsu et al.

[11] Patent Number: 5,392,051
[45] Date of Patent: Feb. 21, 1995

[54] HIGH-FREQUENCY SIGNAL GENERATOR

[75] Inventors: Hiroshi Uematsu; Nobuyuki Takeuchi; Hiroyuki Ando; Shigeki Kato, all of Saitama, Japan

[73] Assignee: Honda Giken Kogyo Kabushiki Kaisha, Tokyo, Japan

[21] Appl. No.: 120,002

[22] Filed: Sep. 10, 1993

[30] Foreign Application Priority Data

Sep. 11, 1992 [JP] Japan .................. 4-269627
Jun. 3, 1993 [JP] Japan .................. 5-157996

[51] Int. Cl.$^6$ ............................................. H03B 5/18
[52] U.S. Cl. ................................. 342/165; 331/68; 331/96
[58] Field of Search ............. 342/165; 331/68, 96

[56] References Cited

U.S. PATENT DOCUMENTS

| | | |
|---|---|---|
| 2,595,078 | 4/1952 | Iams . |
| 4,016,506 | 4/1977 | Kofol . |
| 4,215,313 | 7/1980 | Chang et al. .................. 333/34 |
| 4,426,628 | 1/1984 | Malecki et al. ................. 331/96 |
| 4,463,330 | 7/1984 | Yoneyama . |
| 4,511,865 | 4/1985 | Dixon, Jr. . |
| 4,581,591 | 4/1986 | Jacobs, deceased et al. ..... 331/107 DP |
| 4,814,729 | 3/1989 | Becker ......................... 333/24 C |
| 4,922,211 | 5/1990 | Otremba et al. ................ 331/68 |
| 5,153,531 | 10/1992 | Fujisaki ....................... 331/68 |

OTHER PUBLICATIONS

Millimeter Wave Integrated Circuits Using Nonradiative Dielectric Waveguide, vol. J73-C-1, No. 3, pp. 87-94, 1990.

*Primary Examiner*—Mark Hellner
*Attorney, Agent, or Firm*—Lyon & Lyon

[57] ABSTRACT

A high-frequency signal generator has upper and lower conductive plates parallel to each other, at least one dielectric rod held between the upper and lower conductive plates, a metal mount sandwiched between the upper and lower conductive plates, a oscillating element mounted on a side of the mount for generating a high-frequency signal, a printed-circuit board mounted on the side of the mount and including a bias supply circuit disposed on a surface thereof for supplying a bias voltage to the oscillating element to enable the oscillating element to generate a high-frequency signal, and a positional displacement preventing structure on at least one of the upper and lower conductive plates for preventing the mount from being positionally displaced with respect to the dielectric rod. The positional displacement preventing structure may comprise a groove defined in at least one of the upper and lower conductive plates, the mount being partly fitted in the groove.

20 Claims, 7 Drawing Sheets

HIGH-FREQUENCY SIGNAL GENERATOR

BACKGROUND OF THE INVENTION

1. Field of the Invention

The present invention relates to a high-frequency signal generator for use in a millimeter wave FM radar module installed on a motor vehicle.

2. Description of the Prior Art

Radar devices for use on motor vehicles such as automobiles in combination with warning units for preventing collisions are required to have a high degree of resolution for detecting objects in close distances of about several tens of centimeters. In view of such a high-resolution requirement, an FM radar is preferable to a pulse radar for use in the vehicle-mounted radar devices. Since the maximum range that may be detected up to a target such as a preceding motor vehicle or an upcoming motor vehicle is of a relatively short distance of about several hundred meters, it is suitable for such a radar to use radiowaves in the millimeter range which have a frequency of about 60 GHz and can be attenuated greatly upon propagation in order to prevent radiated radiowaves from being propagated beyond a necessary range and also from interfering with existing microwave communications equipment. Use of millimeter waves is also preferable from the viewpoint of reducing the size of a radar module including an antenna, FM signal generators in front and rear stages, a mixer, and other components.

Heretofore, FM radar modules in the millimeter range are constructed in the form of a microstrip line or a waveguide. Because the microstrip line radiates a large amount of power, it suffers a large loss and tends to cause interference between a plurality of modules, resulting in a reduction in measuring accuracy. The waveguide is disadvantageous in that its circuit is large in size and expensive.

One of the attempts to solve the above problems is a non-radiative dielectric (NRD) waveguide as disclosed in an article "Millimeter wave integrated circuit using a non-radiative dielectric waveguide" written by Yoneyama et al. and published in the Journal of Electronic Information Communications Society, Vol. J 73 c-1 No. 3 pp. 87-94, March 1990. The disclosed non-radiative dielectric waveguide comprises two confronting conductive plates spaced from each other by a distance slightly smaller than a half wavelength and a rod-shaped dielectric member inserted between the conductive plates for allowing only propagations along the rod-shaped dielectric member. The upper and lower surfaces of the non-radiative dielectric waveguide are completely shielded by the conductive plates. Since the distance between the conductive plates is shorter than the half wavelength, radiowaves are fully prevented from leaking laterally out of the non-radiative dielectric waveguide. Therefore, any power radiation from the non-radiative dielectric waveguide is very small, effectively avoiding radiation loss in a module and interference between modules.

Various components including a directional coupler and an isolator can easily be fabricated by positioning non-radiative dielectric waveguides closely to each other or adding ferrite. Therefore, modules employing non-radiative dielectric waveguides can be made smaller than the conventional microstrip arrangement where components are separately produced and interconnected by a waveguide. The above article also discloses small-size, high-performance transmitter and receiver structures for use in the millimeter wave band which employ non-radiative dielectric waveguides.

The article also discloses a gunn oscillator as shown in FIG. 11 of the accompanying drawings and a non-radiative dielectric waveguide for guiding signals which are generated in the millimeter wave band by the gunn oscillator to an antenna or the like. As shown in FIG. 11, the gunn oscillator and its surrounding circuits comprise upper and lower conductive plates 31, 32 serving as a non-radiative dielectric waveguide, a diode mount 33 sandwiched between the upper and lower conductive plates 31, 32, a gunn diode 34 threaded in the diode mount 33, a printed-circuit board 35 fixed to a side of the diode mount 33, a dielectric rod 40 for guiding a signal generated in the millimeter wave band by the gunn diode 34 to an antenna or the like (not shown), and a metal foil oscillator 41 for guiding the signal generated in the millimeter wave band by the gunn diode 34 to the dielectric rod 40.

In FIG. 11, the distance between the upper and lower conductive plates 31, 32 is set to a value slightly smaller than half the wavelength of the signals used in the millimeter wave band. If the signals have a frequency of about 60 GHz, for example, then the distance between the upper and lower conductive plates 31, 32, and hence the thickness of the diode mount 33 is of a small value of about 2.5 mm. Commercially available packaged gunn diodes are mounted on a heat-radiating stud which is of a diameter ranging from 3 to 4 mm. Therefore, it is necessary to machine them to make them ready for use in actual applications, as shown in FIGS. 12(A) and 12(B). First, as shown in FIG. 12(A), a gunn diode 35 is threaded in a metal block which is 5 to 6 mm thick. Then, as shown in FIG. 12(B), upper and lower portions of the metal block are cut off to reduce the thickness thereof to about 2.5 mm, and grooves dimensioned to a $\frac{1}{4}$ wavelength are defined in the metal block to prevent the signals from leaking out. In this manner, the gunn diode 34 is mounted on the diode mount 33.

In a high-frequency signal generator which employs the gunn diode disclosed in the above article, the diode mount is sandwiched between the upper and lower conductive plates so as to be positioned with respect to the metal foil resonator. Therefore, the electric characteristics including the oscillation frequency and the output level tend to be fluctuate to a large extent due to a small positional shift between the diode mount and the dielectric rod, particularly a small rotation in the directions indicated by the arrows in FIG. 11.

Inasmuch as the gunn oscillator requires complex machining as shown in FIGS. 12(A) and 12(B) to fabricate the diode mount 33 that is of a small thickness, the process of manufacturing the gunn oscillator is time-consuming, and the produced gunn oscillator is costly.

The metal foil resonator is dimensionally adjustable for adjusting the oscillation frequency of the high-frequency signal generator. However, the process of adjusting the dimensions of the metal foil resonator is relatively complex to carry out.

In the case where the high-frequency signal generator is used as an FM signal generator in an FM radar module on a motor vehicle, the reverse side of a dielectric plate is bonded to an end face of a dielectric rod by an adhesive or the like, thus fixing the metal foil resonator to the dielectric rod. When the adhesive layer is broken due to vibrations or shocks applied while the motor vehicle is running, the metal foil resonator may peel off the end face of the dielectric rod.

While the above article shows the high-frequency signal generator using the gunn diode, it does not discuss any optimum arrangement for an FM signal generator for use in an FM radar module.

SUMMARY OF THE INVENTION

It is therefore an object of the present invention to provide a high-frequency signal generator which prevents a positional shift between a dielectric rod and a diode mount, particularly an angular displacement, for thereby providing stable characteristics.

Another object of the present invention is to provide a high-frequency signal generator such as an FM signal generator which can be manufactured in a relatively short period of time and at a relatively low cost without the need for a complex machining process for reducing the thickness of a diode mount.

Still another object of the present invention is to provide a high-frequency signal generator that is capable of easily adjusting the oscillation frequency thereof.

Yet another object of the present invention is to provide a high-frequency signal generator which has a resonator that is prevented from peeling off a dielectric rod when vibrations or shocks are applied.

Yet still another object of the present invention is to provide a simple and small high-frequency signal generator in the form of a non-radiative dielectric waveguide which is suitable particularly for use as an FM signal generator in a millimeter wave FM radar module.

According to the present invention, there is provided a high-frequency signal generator comprising upper and lower conductive plates parallel to each other, at least one dielectric rod held between the upper and lower conductive plates, a metal mount sandwiched between the upper and lower conductive plates, an oscillating element mounted on a side of the mount for generating a high-frequency signal, a printed-circuit board mounted on the side of the mount and including a bias supply circuit disposed on a surface thereof for supplying a bias voltage to the oscillating element to enable the oscillating element to generate a high-frequency signal, and positional displacement preventing means on at least one of the upper and lower conductive plates for preventing the mount from being positionally displaced with respect to the dielectric rod.

The positional displacement preventing means may comprise a groove defined in at least one of the upper and lower conductive plates, the mount being partly fitted in the groove.

The positional displacement preventing means may comprise a pair of guide rails disposed on at least one of the upper and lower conductive plates, the guide rails sandwiching the mount on opposite sides thereof which include the side.

The positional displacement preventing means may comprise a recess defined in an inner surface of at least one of the upper and lower conductive plates, and an inner conductive plate disposed in the recess for sliding movement in a direction perpendicular to the dielectric rod and having an inner surface lying flush with the inner surface of the at least one of the upper and lower conductive plates, the mount being held on the inner surface of the inner conductive plate. A groove may be defined in the inner surface of the inner conductive plate, the mount being partly fitted fixedly in the groove.

The above and further objects, details and advantages of the present invention will become apparent from the following detailed description of preferred embodiments thereof, when read in conjunction with the accompanying drawings.

DETAILED DESCRIPTION OF THE PREFERRED EMBODIMENTS

Figure 1:
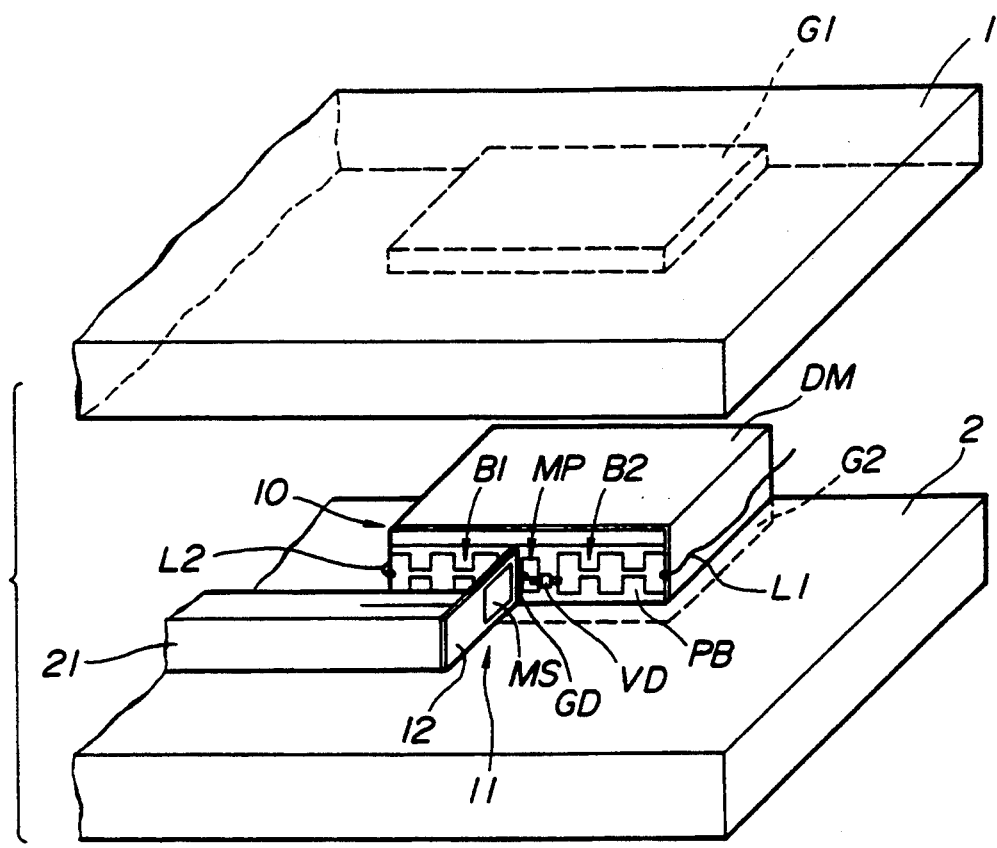
FIG. 1 is an exploded perspective view of a high-frequency signal generator according to a first embodiment of the present invention and associated components of a radar module which incorporates the high-frequency signal generator.

FIG. 1 shows a high-frequency signal generator 10 according to a first embodiment of the present invention and its associated components, the high-frequency signal generator 10 being used as an FM signal generator in an FM radar module in the millimeter wave band for use on a motor vehicle such as an automobile.

As shown in FIG. 1, upper and lower parallel conductive plates 1, 2 serving as a non-radiative dielectric waveguide hold therebetween a dielectric rod 21 that constitutes part of the non-radiative dielectric waveguide, a diode mount DM of metal kept at a ground potential, a gunn diode member or gunn diode GD mounted on a side of the diode mount DM, a printed-circuit board PB fixed to the same side of the diode mount DM and having a bias supply circuit for supplying a bias voltage to the gunn diode GD, and an resonator 11 interposed between the printed-circuit board PB and the dielectric rod 21.

Figure 2:
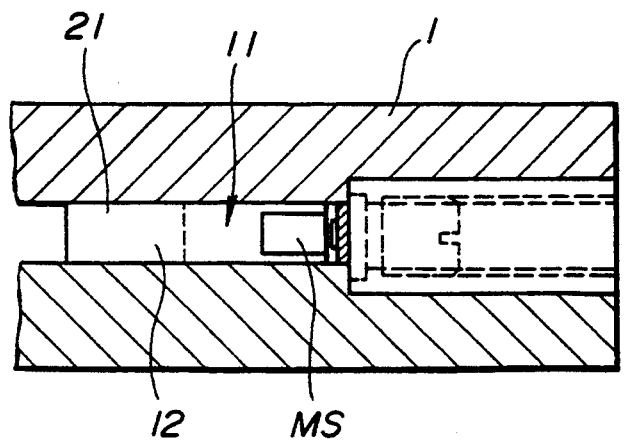
FIG. 2 is a cross-sectional view of the high-frequency signal generator and associated components shown in FIG. 1.

The upper and lower parallel conductive plates 1, 2 have respective rectangular recesses G1, G2 defined therein in which respective upper and lower portions of the diode mount DM are fitted. As shown in FIG. 2, the diode mount DM is accurately positioned with respect to the resonator 11 by being partly accommodated in the recesses G1, G2 which thus serve as a means for preventing a positional displacement.

Figure 3:
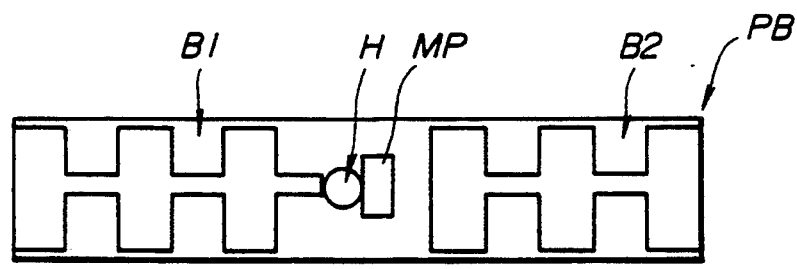
FIG. 3 is a plan view of a printed-curcuit board in the high-frequency signal generator shown in FIG. 1.

As shown in FIG. 3, the printed-circuit board PB has a central through hole H defined therein and first and second bias supply microstrip lines B1, B2 disposed on a surface of the printed-circuit board PB one on each side of the central through hole H, the first and second bias supply microstrip lines B1, B2 serving as the bias supply circuit. A rectangular metal pattern MP (described later on) is disposed between the first and second bias supply microstrip lines B1, B2, specifically between the through hole H and the second bias supply microstrip line B2. As shown in FIG. 1, leads L1, L2 are connected respectively to the first and second bias supply microstrip lines B1, B2.

The diode mount DM has an internally threaded hole defined centrally there and opening at a side thereof. The gunn diode DM has a gunn diode element as an oscillating element housed in a package held by a heat-radiating stud which is threaded in the internally threaded hole in the diode mount DM. The gunn diode element is thus fixed to the central region of the side of the diode mount DM. The gunn diode element is housed in the package upside down with its operating layer facing downwardly. The gunn diode element 5 has a heat-generating terminal connected through the heat-radiating stud to the diode mount DM, and is kept at the ground potential that is supplied to the diode mount DM.

The distal end of the package which houses the gunn diode element is inserted through the hole H that is defined in the printed-circuit board PB which is fixed by an adhesive or the like to the side of the diode mount DM. The distal end of the package is exposed at the surface of the printed-circuit board PB, and electrically connected by thermal compression to a gold foil GL that extends between and is joined by thermal compression to the first bias supply line B1 and the metal pattern MP on the printed-circuit board PB.

Figure 4:
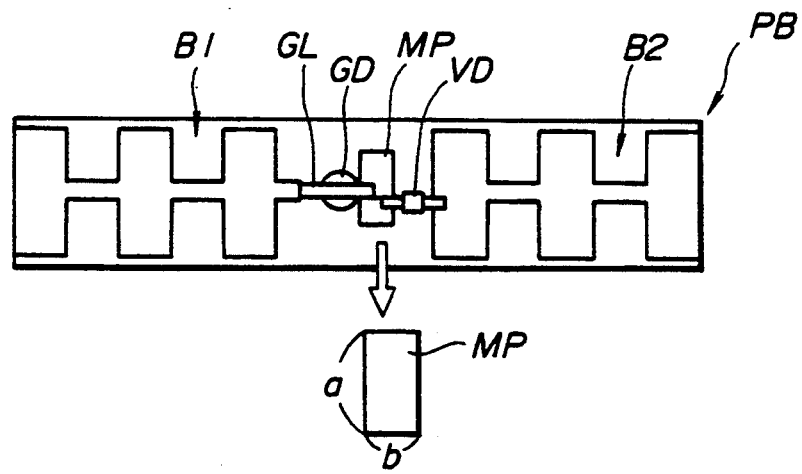
FIG. 4 is a plan view of the printed-circuit board with a gunn diode and a varactor diode mounted thereon.

According to this embodiment, a frequency-modulating varactor diode VD of the beam lead type extends between and is joined by thermal compression to the metal pattern MP and the second bias supply line B2 on the printed-circuit board PB, as shown in FIG. 4. Therefore, the bias voltage on the gunn diode GD is adjusted by a bias voltage applied to the first bias supply line B1, and the bias voltage on the varactor diode VD is adjusted by the difference between bias voltages applied to the first and second bias supply lines B1, B2. The high-frequency signal generator 10 which is composed of the gunn diode GD and other components can function as an FM signal generator when the varactor diode VD is mounted.

Each of the first and second bias supply lines B1, B2 serves as a five-stage low-pass filter with its larger and smaller line width variations repeated at a constant period which is set to ¼ of the wavelength of FM signals that are to be generated in the millimeter wave band by the high-frequency signal generator. In this embodiment, the FM signals have a frequency of about 60 GHz, and hence the larger and smaller line width variations of the low-pass filter are repeated at the period of about 1.25 mm. The distance between the conductive plates 1, 2 of the non-radiative dielectric waveguide or the height of the side of the diode mount DM is set to a value of 2.5 mm or lower which is slightly smaller than half the wavelength of the FM signals.

Figure 5:
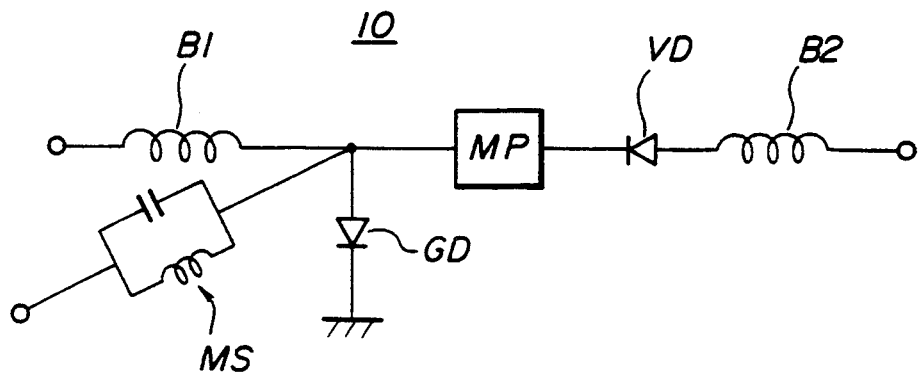
FIG. 5 is a circuit diagram of an equivalent circuit of the high-frequency signal generator.

FIG. 5 shows an equivalent circuit of the high-frequency signal generator 10, i.e., the FM signal generator 10 and its associated components, shown in FIG. 1. The metal foil resonator 11 which comprises a rectangular metal foil MS on the thin dielectric substrate 12 is interposed between the FM signal generator 10 or the gunn diode GD and the dielectric rod 21. The FM signals can be adjusted by adjusting the dimensions of the metal foil MS. The FM signals can also be adjusted by the dimensions of the rectangular metal pattern MP on the printed-circuit board PB. The metal foil MS may be replaced with a metal rod.

It has been confirmed that the oscillation frequency of the FM signal generator 10 can be roughly adjusted by dimensions a, b, shown in FIG. 4, of the rectangular metal pattern MP, and can be finely adjusted by the metal foil resonator 11 as shown in FIG. 1. Examples of the rough adjustment will be described below.

When the dimension b of the metal pattern MP was fixed to 0.3 mm and the other dimension a was varied, the oscillation frequency was varied as shown in Table 1 below before and after the metal foil resonator 11 was added to the non-radiative dielectric waveguide shown in FIG. 1 for propagation therethrough.

TABLE I

| Dimension a | Before added | After added |
| --- | --- | --- |
| 1.2 mm | 51.4 GHz | — |
| 0.8 mm | 55.6 GHz | 59.5 GHz |
| 0.6 mm | 57.4 GHz | 61.0 GHz |

When the dimension a of the metal pattern MP was fixed to 0.8 mm and the other dimension b was varied, the oscillation frequency was varied as shown in Table 2 below before and after the metal foil resonator 11 was added to the non-radiative dielectric waveguide shown in FIG. 1 for propagation therethrough.

TABLE 2

| Dimension b | Before added | After added |
| --- | --- | --- |
| 0.4 mm | 53.2 GHz | 57.5 GHz |
| 0.3 mm | 55.6 GHz | 59.5 GHz |
| 0.2 mm | 57.7 GHz | 61.8 GHz |

Figure 6:
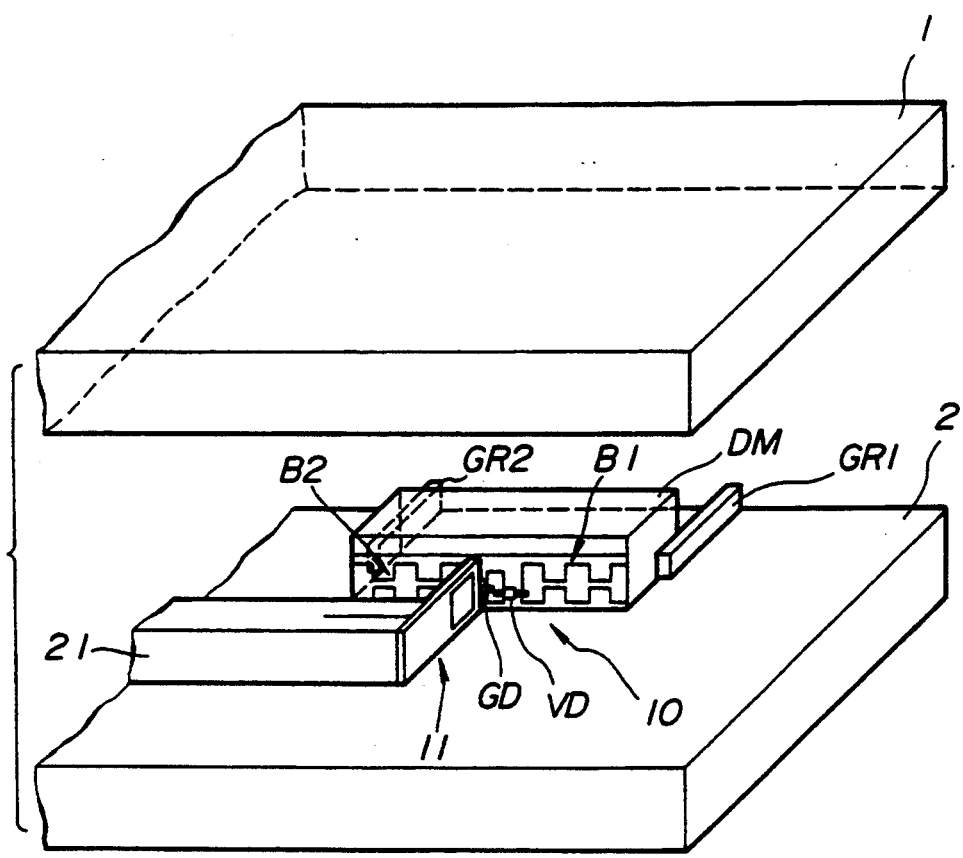
FIG. 6 is an exploded perspective view of a high-frequency signal generator according to a second embodiment of the present invention and associated components of a radar module which incorporates the high-frequency signal generator.

FIG. 6 shows in exploded perspective a high-frequency signal generator according to a second embodiment of the present invention and its associated components, the high-frequency signal generator serving as an FM signal generator. Those parts shown in FIG. 6 which are identical to those shown in FIG. 1 are denoted by identical reference characters, and will not be described below.

In the second embodiment, a generated FM signal is of a relatively low frequency, and hence the distance between the upper and lower conductive plates 1, 2, and hence the thickness of the diode mount DM is relatively large. The diode mount DM has its both sides sandwiched laterally by guide rails GR1, GR2 disposed as a positional displacement preventing means on the lower conductive plate 2, and is also sandwiched vertically between the upper and lower conductive plates 1, 2. Thus, the diode mount DM is accurately positioned with respect to the metal foil resonator 11.

Figure 7:
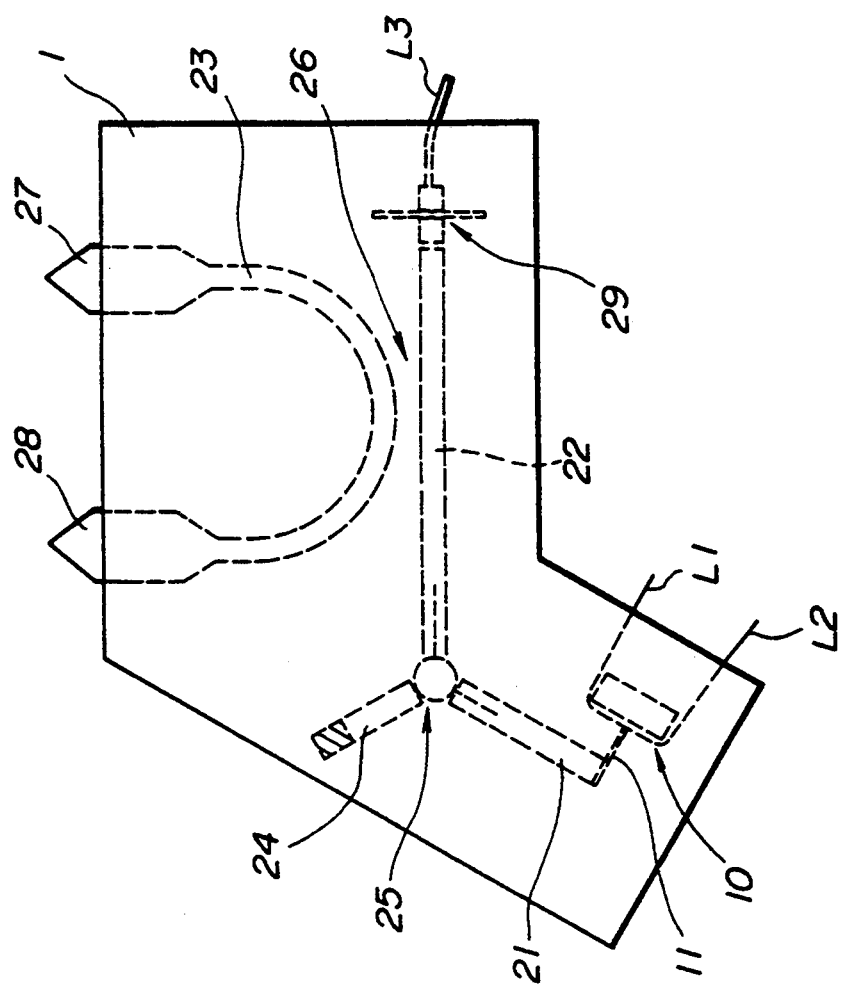
FIG. 7 is a schematic plan view of an FM radar module in the form of a non-radiative dielectric waveguide which incorporates the high-frequency signal generator.

FIG. 7 shows a radar module incorporating the high-frequency signal generator 10 as an FM signal generator.

The radar module functions as an FM radar module as the high-frequency signal generator 10 functions as an FM signal generator. The FM radar module has the FM signal generator 10, the metal foil resonator 11, a propagating means composed of various dielectric rods and other parts, and an antenna means.

The propagating means comprises the dielectric rod 21 as a first dielectric rod held between the upper and lower parallel conductive plates 1, 2, an isolator 25, a linear second dielectric rod 22 coupled to the first dielectric rod 21 through the isolator 25, a semicircular third dielectric rod 23 coupled to the second dielectric rod 22 through a directional coupler 26, and a fourth dielectric rod 24 coupled to the second dielectric rod 22 through the isolator 25. A single-diode mixer 29 is joined to the distal end of the second dielectric rod 22. The third dielectric rod 23 has a transmitting antenna 27 and a receiving antenna 28 respectively on its opposite ends. A resistive terminator is coupled to the distal end of the fourth dielectric rod 24.

In operation, an FM signal generated by the FM signal generator 10 is propagated through the first dielectric rod 21 and supplied to an input terminal of the isolator 25. The FM signal is then outputted from an output terminal of the isolator 25 to the linear second dielectric rod 22. The linear second dielectric rod 22 and the semicircular third dielectric rod 23, which has its convex portion disposed near the central region of the linear second dielectric rod 22, jointly form the directional coupler 26. Therefore, a portion of the FM signal outputted from the isolator 25 is transferred to the third dielectric rod 23, and radiated out from the transmitting antenna 27 on one of the ends of the third dielectric rod 23. The remainder of the FM signal outputted from the isolator 25 is propagated through the linear second dielectric rod 22 to its distal end where it is supplied as a local signal to the single-diode mixer 29.

A reflected wave (reflected signal) from an object is received by the receiving antenna 28. A portion of the received signal is transferred through the directional coupler 26 to the linear second dielectric rod 22, from which it is supplied to the single-diode mixer 29. The remainder of the received signal is radiated again from the transmitting antenna 27. The single-diode mixer 29 is supplied with the local signal from the output terminal of the isolator 25 through the second dielectric rod 22 and also with the reflected wave from the receiving antenna 28 through the directional coupler 26. The single-diode mixer 29 mixes the supplied signals and generates a beat signal, which is outputted to a coaxial line L3 extending from between the upper and lower conductive plates 1, 2.

The transmitting antenna 27 also receives the reflected wave from the object. The received signal is propagated through the semicircular third dielectric rod 23 to the receiving antenna 28, which radiates the signal again. A portion of the reflected wave received by the transmitting antenna 27 and a portion of the reflected signal which is reflected toward the FM signal generator 10 by the single-diode mixer 29 are supplied through the directional coupler 26 and the second dielectric rod 22 to the isolator 25, and then absorbed by the resistive terminator joined to the fourth dielectric rod 24.

Since the transmitting and receiving antennas 27, 28 share the directional coupler 26, these antennas radiate waves again and again. Thus, a portion of the received reflected wave is delayed from the reflected wave which is required by the single-diode mixer 29, and applied as an unnecessary wave to the single-diode mixer 29. However, inasmuch as this unnecessary wave is produced by an FM signal that has reciprocated twice or more between the antenna and the reflecting object, it is of a level sufficiently lower than the level of the reflected wave that is required by the single-diode mixer 29 because of a relatively low gain of the transmitting and receiving antennas 26, 27 and a large space propagation loss, and hence any effect of the unnecessary wave on the radar functions can be ignored.

While the upper and lower conductive plates have respective recesses for partly housing the diode mount therein in the first embodiment shown in FIG. 1, a recess for partly housing the diode mount may be defined in only one of the conductive plates.

In the second embodiment shown in FIG. 6, the guide rails are mounted on only the lower conductive plate. However, guide rails may be mounted on the upper conductive plate or on both the upper and lower conductive plates.

Therefore, the diode mount can accurately be positioned on the dielectric rod of the non-radiative dielectric waveguide for stable characteristics. Particularly where the diode mount is partly housed in the recesses defined in the upper and lower conductive plates, the thickness of the diode mount which is required when signals of relatively high frequencies are used can be reduced, the diode mount does not require complex machining, and can be manufactured less costly.

The above embodiments have been described as being applied to an FM signal generator in an FM radar module. However, the present invention is also applicable to a high-frequency signal generator such as a local oscillator.

A high-frequency signal generator according to a third embodiment of the present invention will be described below.

As described above, the resonator 11 of the high-frequency signal generator shown in FIG. 1 is composed of the dielectric substrate 12 and the metal foil MS disposed on the surface thereof. The dielectric substrate 12 has its distal end portion supporting the metal foil MS and positioned in confronting relationship to the gunn diode GD mounted on the diode mount DM, and the reverse side of the opposite end of the dielectric substrate 12 is bonded to an end face of the dielectric rod 21.

The central frequency of an FM signal to be generated can be controlled to fall in a range of about 60 GHz±5 GHz by combining the oscillation characteristics of the gunn diode GD and the resonance characteristics of the resonator 11. The resonance characteristics of the resonator 11 depend on the dimensions of the metal foil MS, particularly its length along the signal propagating direction (X-axis direction) in the resonator 11, i.e., along the longitudinal direction of the dielectric substrate 12.

The length of the metal foil MS in the X-axis direction is set to a range of 1.5 mm±0.5 mm if the central frequency of the FM signal is 60 GHz. Specifically, resonators 11 with metal foils MS of different lengths are employed and the central frequencies are measured on a trial-and-error basis until a resonator 11 that is to be used is finally selected. The distance between the diode mount DM and the gunn diode GD is determined so that the distance between the dielectric rod 21 and the gunn diode GD is equal to the length of the metal foil MS, i.e., the side of the dielectric rod 21 which faces the gunn diode GD is aligned with the end of the metal foil MS. Since the dielectric rod 21 is fixedly bonded to the lower conductive plate 2, each time the length of the metal foil MS is varied, the diode mount DM held in the recesses is slid in the recesses and then fastened by screws from outside of the upper and lower conductive plates. Therefore, in order to select a different central frequency with the high-frequency signal generator according to the first embodiment, the diode mount should be allowed to slide, and hence the recesses should be longer than the diode mount DM.

As a consequence, a gap may be created between the printed-circuit board and the ends of the recesses. Inasmuch as such a gap adversely affects the oscillation characteristics of the gun diode GD, it may become difficult to adjust the frequency.

The high-frequency signal generator according to the third embodiment has a conductive plate structure which does not have any gap that would make it difficult to adjust the frequency.

Figure 8:
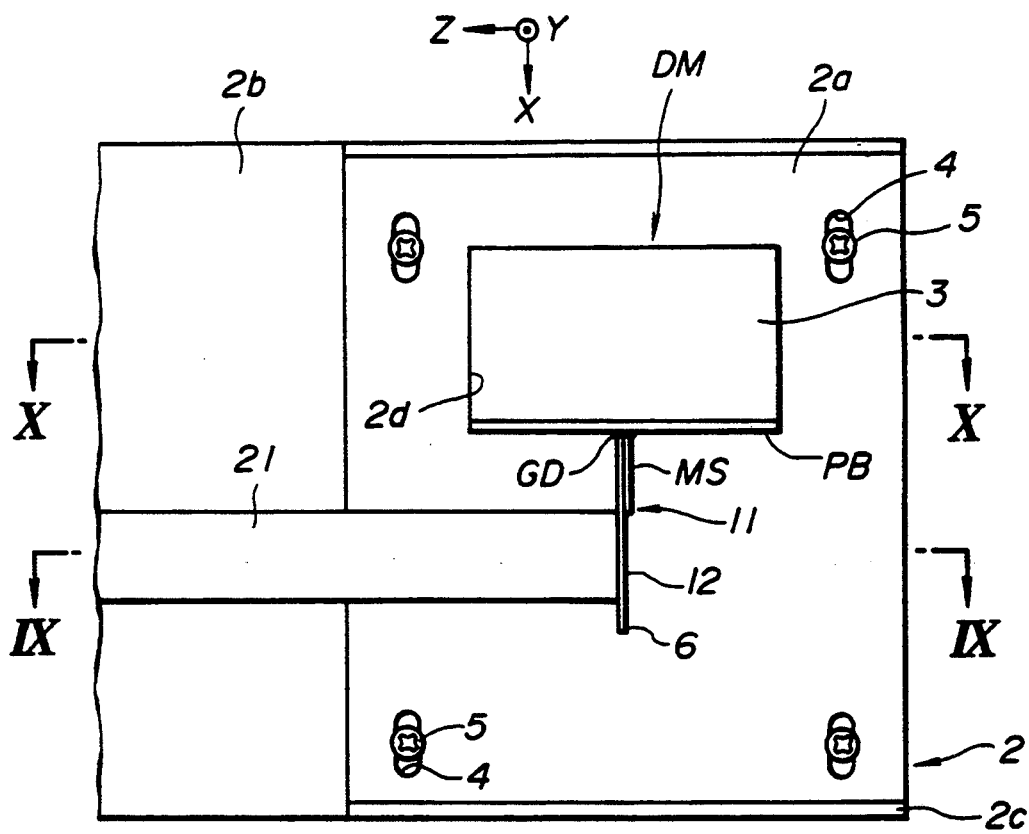
FIG. 8 is a fragmentary plan view of a high-frequency signal generator according to a third embodiment of the present invention.

FIG. 8 shows in plan the high-frequency signal generator according to the third embodiment. The other components than the upper and lower conductive plates 1, 2, i.e., the diode mount DM, the printed-circuit board PB, and the dielectric rod 21, are identical to those of the first and second embodiments, and will not be described in detail below.

In FIG. 8, the upper conductive plate 1 of the non-radiative dielectric waveguide is omitted from illustration. The letters X, Y, Z represent the respective axes of an orthogonal three-dimensional coordinate system which is added for illustrative purpose.

Figure 9:
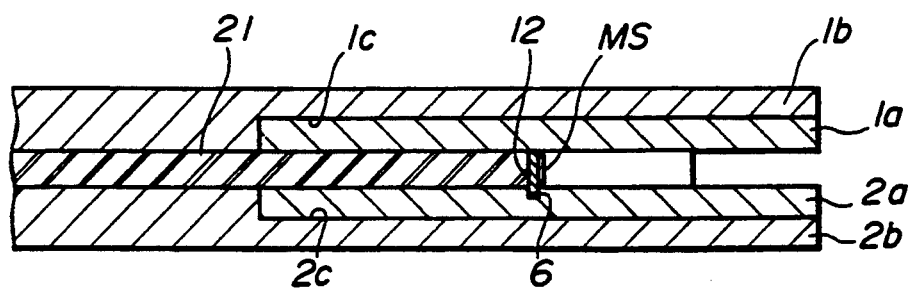
FIG. 9 is a cross-sectional view taken along line IX—IX of FIG. 8.
Figure 10:
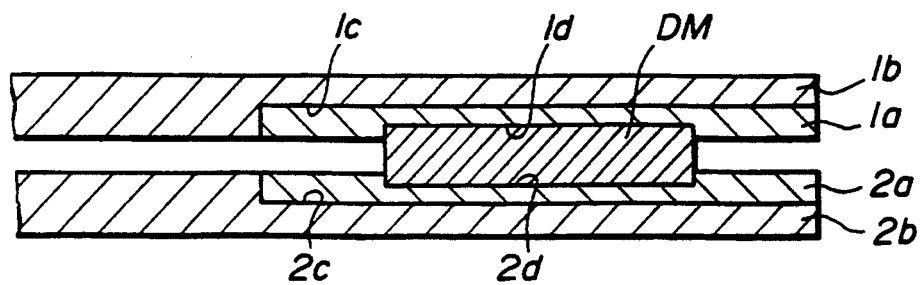
FIG. 10 is a cross-sectional view taken along line X—X of FIG. 8.
Figure 11:
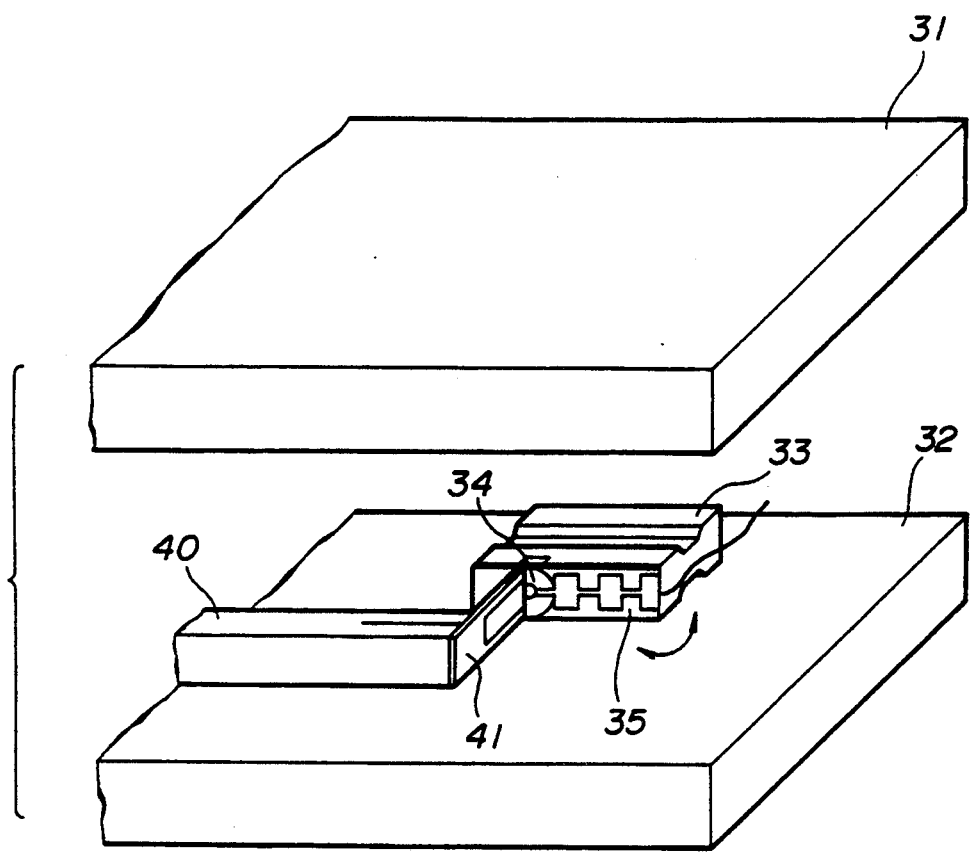
FIG. 11 is an exploded perspective view of a conventional high-frequency signal generator and associated components.
Figure 12:
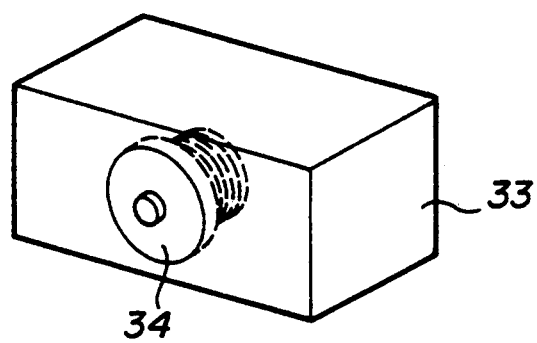
FIG. 12(A) is a perspective view of a conventional diode mount and a gunn diode mounted thereon.
FIG. 12(B) is a perspective view of the diode mount and the gunn diode shown in FIG. 12(A) which have been cut off.
Figure 12:
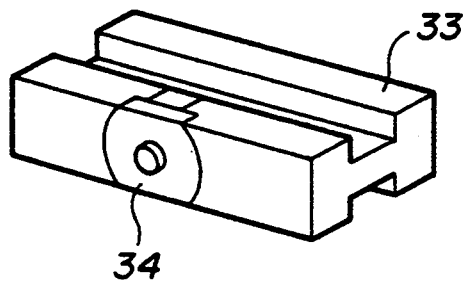

The high-frequency FM signal generator according to this embodiment has upper and lower conductive plates serving as a non-radiative dielectric waveguide. As shown in FIGS. 9 and 10, these upper and lower conductive plates comprise respective outer conductive plates 1b, 2b having respective steps or recesses 1c, 2c defined in their inner surfaces to provide a different thickness in the Z-axis direction and respective inner conductive plates 1a, 2a having a thickness equal to the depth of the recesses 1c, 2c and slidable in the X-axis direction. The inner conductive plates 1a, 2a, which are slidably disposed in the respective recesses 1c, 2c, have respective inner surfaces lying flush with the inner surfaces of the outer conductive plates 1b, 2b. The inner conductive plates 1a, 2a have respective grooves 1d, 2d defined in the inner surfaces thereof. A diode mount DM includes a metal block 3 having upper and lower portions fitted in the respective grooves 1d, 2d. Therefore, the diode mount DM is fixed against displacement in the X- and Z-axis directions and rotation around the Y-axis.

During the process of adjusting the oscillation frequency, the bottom of the dielectric rod 21 is fixedly bonded to only the surface of the outer conductive plate 2b, and is slidable with respect to the surfaces of the inner conductive plates 1a, 2a. Each time the length of the metal foil MS of the resonator 11 is varied, the inner conductive plates 1a, 2a are slid on the outer conductive plates 1b, 2b for thereby adjusting the distance between the gunn diode GD and the side of the dielectric rod 21 which faces the diode mount DM. The lower inner conductive plate 2a has oblong holes 4 extending longitudinally the X-axis direction. After the distance has been adjusted, screws 5 are inserted trough the oblong holes 4 and threaded into internally threaded holes defined in the lower outer conductive plate 2b, thus coupling the lower inner conductive plate 2a to the lower outer conductive plate 2b. Furthermore, after the distance has been adjusted, the bottom of the dielectric rod 21 is fixedly bonded to the surface of the inner conductive plate 2a.

The inner conductive plate 2a has a slot 6 extending in the Y-axis direction in the region where the resonator 11 is located. The lower end of the dielectric plate 12 of the resonator 11 is inserted in the slot 6. Therefore, the resonator 11 bonded to the end face of the dielectric rod 21 is prevented from being displaced in the X-axis direction, and hence from peeling off due to vibrations and shocks.

While the slot receiving the lower end of the dielectric plate of the resonator is defined in the lower inner conductive plate in the above embodiment, a slot receiving the upper end of the dielectric plate may be defined in the upper inner conductive plate. In the above embodiment, the grooves in which the metal block is partly housed are defined respectively in the upper and lower inner conductive plates. However, a groove for partly receiving the metal block may be defined in only one of the upper and lower inner conductive plates.

While the FM signal generator is illustrated as a high-frequency signal generator in the third embodiment, the principles of the third embodiment are also applicable to a simple high-frequency signal generator which generates a high-frequency signal of a constant frequency.

In the high-frequency signal generator according to the third embodiment, the inner conductive plates which have respective grooves for inserting the diode mount are slidable with respect to the outer conductive plates. Therefore, any gap which would otherwise adversely affect the oscillation characteristics of the gunn diode is not created between the diode mount and the grooves, allowing the oscillation frequency to be adjusted with ease.

Since at least one of the upper and lower ends of the dielectric plate of the resonator is inserted in the slot in the inner conductive plate, the bonded dielectric plate is prevented from peeling off, and its reliability is increased.

The high-frequency signal generators according to the first through third embodiments can easily be arranged as an FM signal generator. They can be used as an FM signal generator in the millimeter wave band for use in an FM radar module in the form of a non-radiative dielectric waveguide, for easily and reliably controlling the frequency of an FM signal. The high-frequency signal generators are also simple in structure and small in size.

Since the metal pattern on the printed-circuit board is dimensionally adjustable for adjusting the oscillation frequency of the gunn diode, the oscillation frequency of the high-frequency signal generator such as an FM signal generator can easily be adjusted or changed simply by replacing the printed-circuit board.

The high-frequency signal generator has been described which can be incorporated in a radar module employing a non-radiative dielectric waveguide, the propagation line is not limited to the non-radiative dielectric waveguide, but may be a dielectric waveguide such as an H guide or an insular waveguide.

The high-frequency signal generating element is not limited to the gunn diode, but may be any of various other solid-state oscillating elements including an IMPATT diode, a TUNNET diode, a BARIT diode, a JRAPATT diode, an LSA diode, etc.

Although there have been described what are at present considered to be the preferred embodiments of the invention, it will be understood that the invention may be embodied in other specific forms without departing from the essential characteristics thereof. The present embodiments are therefore to be considered in all respects as illustrative, and not restrictive. The scope of the invention is indicated by the appended claims rather than by the foregoing description.

What is claimed is:

1. A high-frequency signal generator comprising:
   upper and lower conductive plates parallel to each other;
   at least one dielectric rod held between said upper and lower conductive plates for transmitting high-frequency signals;
   a metal mount sandwiched between said upper and lower conductive plates;
   an oscillating element mounted on a side of said mount for generating a high-frequency signal;
   a printed-circuit board mounted on said side of the mount and including a bias supply circuit disposed on a surface thereof for supplying a bias voltage to said oscillating element to enable to oscillating element to generate said high-frequency signal; and
   positional displacement preventing means on at least one of said upper and lower conductive plates for preventing said mount from being positionally displaced with respect to said dielectric rod.

2. A high-frequency signal generator according to claim 1, wherein said positional displacement preventing means comprises a groove defined in at least one of said upper and lower conductive plates, said mount being partly fitted in said groove.

3. A high-frequency signal generator according to claim 1, wherein said positional displacement preventing means comprises a groove defined in at least one of said upper and lower conductive plates, said mount having a lower portion entirely fitted in said groove.

4. A high-frequency signal generator according to claim 1, wherein said positional displacement preventing means comprises a pair of grooves defined respectively in said upper and lower conductive plates, said mount having upper and lower portions fitted entirely in said grooves, respectively.

5. A high-frequency signal generator according to claim 1, wherein said positional displacement preventing means comprises a pair of guide rails disposed on at least one of said upper and lower conductive plates, said guide rails sandwiching said mount on opposite sides thereof which include said side.

6. A high-frequency signal generator according to claim 1, wherein said positional displacement preventing means comprises a recess defined in an inner surface of at least one of said upper and lower conductive plates, and an inner conductive plate disposed in said recess for sliding movement in a direction perpendicular to said dielectric rod and having an inner surface lying flush with said inner surface of said at least one of the upper and lower conductive plates, said mount being held on said inner surface of said inner conductive plate.

7. A high-frequency signal generator according to claim 6, wherein said positional displacement preventing means further comprises a groove defined in said inner surface of said inner conductive plate, said mount being partly fitted fixedly in said groove.

8. A high-frequency signal generator according to claim 7, said recess, said inner conductive plate, and said groove are provided on each of said upper and lower conductive plates.

9. A high-frequency signal generator according to claim 7, further comprising:
   a resonator disposed between said oscillating element and said dielectric rod for propagating a high-frequency signal generated by said oscillating element to said dielectric rod;
   said resonator comprising a dielectric substrate mounted on an end face of said dielectric rod and facing said oscillating element, and a metal foil disposed on said dielectric substrate;
   said dielectric substrate being fixedly inserted in a slot defined in said inner surface of the inner conductive plate.

10. A high-frequency signal generator comprising:
    a conductive plate;
    at least one dielectric rod mounted on said conductive plate for transmitting high-frequency signals;
    a mount;
    an oscillating element mounted on a side of said mount for generating a high-frequency signal;
    a printed-circuit board mounted on said side of the mount and including a bias supply circuit disposed on a surface thereof for supplying a bias voltage to said oscillating element to enable the oscillating element to generate said high-frequency signal; and
    positional displacement preventing means on said conductive plate for preventing said mount from being positionally displaced with respect to said dielectric rod.

11. A high-frequency signal generator according to claim 10, wherein said positional displacement preventing means comprises a groove defined in said conductive plate, said mount being partly fitted in said groove.

12. A high-frequency signal generator according to claim 10, wherein said positional displacement preventing means comprises a pair of guide rails disposed on said conductive plate, said guide rails sandwiching said mount on opposite sides thereof which include said side.

13. A high-frequency signal generator according to claim 10, wherein said positional displacement preventing means comprises a recess defined in said conductive plate, and an inner conductive plate disposed in said recess for sliding movement in a direction perpendicular to said dielectric rod and lying flush with said conductive plate, said mount being held on said inner conductive plate.

14. A high-frequency signal generator according to claim 13, wherein said positional displacement preventing means further comprises a groove defined in said inner conductive plate, said mount being partly fitted fixedly in said groove.

15. A high-frequency signal generator according to claim 14, further comprising:
    a resonator disposed between said oscillating element and said dielectric rod for propagating a high-frequency signal generated by said oscillating element to said dielectric rod;

said resonator comprising a dielectric substrate mounted on an end face of said dielectric rod and facing said oscillating element, and a metal foil disposed on said dielectric substrate;

said dielectric substrate being fixedly inserted in a slot defined in said inner conductive plate.

16. A high-frequency signal generator according to claim 10, wherein said positional displacement preventing means includes means for adjusting a relative distance between said mount and said dielectric rod.

17. A high-frequency signal generator comprising:
a conductive plate;
at least one dielectric rod mounted on said conductive plate for transmitting high-frequency signals;
mount means for holding said oscillating element thereon;
resonating means for propagating a high-frequency generated by said oscillating element to said dielectric rod; and
positional displacement preventing means for, upon holding said resonating means onto said conductive plate, preventing said resonating means from being positionally displaced with respect to said conductive plate.

18. A high-frequency signal generator according to claim 17, wherein said resonating means includes a substrate and a metal foil disposed on said substrate.

19. A high-frequency signal generator according to claim 17, wherein said positional displacement preventing means includes a part of said conductive plate, said plate part having a groove adapted for receiving said substrate of said resonating means.

20. A high-frequency signal generator according to claim 17, wherein said conductive plate is divided into a first part and a second part defining thereon a recess in which said first part is slidably received, said positional displacement preventing means including said first part of said conductive plate, said first part being slidable in a direction perpendicular to that in which said dielectric rod longitudinally extends.

* * * * *

UNITED STATES PATENT AND TRADEMARK OFFICE
CERTIFICATE OF CORRECTION

PATENT NO. : 5,392,051
DATED : February 21, 1995
INVENTOR(S) : Hiroshi Uematsu; Nobuyoshi Takeuchi; Hiroyuko Ando; Shigeki Kato It is certified that error appears in the above-indentified patent and that said Letters Patent is hereby corrected as shown below:

Title page, item [75]:

In the listing of inventors, please change the spelling of the name "Nobuyuki Takeuchi" to -- Nobuyoshi Takeuchi --.

Signed and Sealed this

Twenty-third Day of April, 1996

*Attest:*

BRUCE LEHMAN

*Attesting Officer*  *Commissioner of Patents and Trademarks*